United States Patent [19]

Williams et al.

[11] Patent Number: 5,447,784
[45] Date of Patent: Sep. 5, 1995

[54] ELECTROSTATIC DISSIPATING COVER TAPE

[75] Inventors: Gregory D. Williams, Matthews, N.C.; Leonard Holley, Edgemon, S.C.; Jeffrey D. Lovelace, Concord, N.C.

[73] Assignee: Rexham Industries Corp., Matthews, N.C.

[21] Appl. No.: 252,177

[22] Filed: Jun. 1, 1994

[51] Int. Cl.6 .............................................. B32B 7/12
[52] U.S. Cl. ..................................... 428/220; 428/354; 428/355; 428/922; 206/713; 206/719
[58] Field of Search ............... 428/324, 328, 354, 355, 428/922, 220; 206/328

[56] References Cited

U.S. PATENT DOCUMENTS

| | | | |
|---|---|---|---|
| 4,154,344 | 5/1979 | Yenni, Jr. et al. | 428/922 |
| 4,156,751 | 5/1979 | Yenni, Jr. et al. | 428/212 |
| 4,484,250 | 11/1984 | Rzepecki et al. | 361/220 |
| 4,699,830 | 10/1987 | White | 428/922 |
| 4,702,788 | 10/1987 | Okui | 428/40 |
| 4,738,882 | 4/1988 | Rayford et al. | 428/218 |
| 4,746,574 | 5/1988 | Hattori et al. | 428/212 |
| 4,906,494 | 3/1990 | Babinec et al. | 428/35.2 |
| 4,929,486 | 5/1990 | Itou et al. | 428/77 |
| 4,954,389 | 9/1990 | Acharya et al. | 428/212 |
| 4,963,405 | 10/1990 | Yamashita et al. | 428/40 |
| 4,981,544 | 1/1991 | Nordale | 156/252 |
| 5,025,923 | 6/1991 | Okui | 206/329 |
| 5,041,319 | 8/1991 | Becker et al. | 428/71 |
| 5,064,064 | 11/1991 | Itou et al. | 206/330 |
| 5,073,425 | 12/1991 | Dees, Jr. et al. | 428/48 |
| 5,104,583 | 4/1992 | Richardson | 252/518 |
| 5,110,639 | 5/1992 | Akao | 428/35.2 |
| 5,158,818 | 10/1992 | Aurichio | 428/40 |
| 5,170,328 | 12/1992 | Kruppa | 361/398 |
| 5,180,615 | 1/1993 | Havens | 428/35.3 |
| 5,208,103 | 5/1993 | Miyamoto et al. | 428/354 |
| 5,254,201 | 10/1993 | Konda et al. | 156/344 |

FOREIGN PATENT DOCUMENTS

0522194A1 12/1991 European Pat. Off. .

OTHER PUBLICATIONS

Capano et al., The Application of Zelec ECP in Static Dissipative Systems, H-41685 (Sep. 1992), DuPont Chemicals, Jackson Laboratory, Chambers Works, New Jersey.

Robert S. Lawton, H. Richard Linton, Howard W. Jacobson, and Paul J. Capano, *Development of Highly Efficient, Static Dissipative Systems Based on Electroconductive Powders*, H-41686 (Sep. 1992), Du Pont Chemicals, Jackson Laboratory, Chambers Works, Deepwater, New Jersey.

*Primary Examiner*—Alexander S. Thomas
*Attorney, Agent, or Firm*—Bell, Seltzer, Park & Gibson

[57] ABSTRACT

A transparent static dissipative adhesive tape is disclosed. The tape comprises a transparent polymer substrate having opposed first and second surfaces, a transparent static dissipative coating on the first surface of the substrate, and a transparent static dissipative adhesive coating on the second surface of the substrate. The adhesive coating comprises a transparent conductive layer on the second surface formed of conductive particles in a polymer matrix, and a transparent adhesive layer without any conductive particles over the conductive layer. The exposed surface of the adhesive layer exhibits conductivity substantially the same as the conductivity of the underlying conductive layer.

20 Claims, 1 Drawing Sheet

ELECTROSTATIC DISSIPATING COVER TAPE

FIELD OF THE INVENTION

The present invention relates to the packaging and handling of small electronic components, and in particular relates to the packaging of such components in carrier tapes.

BACKGROUND OF THE INVENTION

Small electronic components such as integrated circuits or "chips" are often carried in linear packages known as "tapes." These tapes often consist of plastic strips of molded pockets, and are frequently bordered by sprocket holes. By packaging the components in such a manner, the strips can be mechanically fed or advanced along a fully or partially automated assembly line. In such lines, the components are frequently removed from the strip's pockets by automated (e.g. robotic) equipment which then places the components in their next desired position, for example on a circuit board. When originally packaged and shipped in the strips, the pocketed components are also secured in place by a cover that overlies the pockets.

The overlying cover often takes the form of an adhesively backed tape that matches the width of the pocketed strip. Preferably, the tape should be transparent so that the identity of the components in the pockets is clearly visible. Furthermore, in many circumstances the tape also should be static dissipative or antistatic in character in order to protect the components from the potentially harmful effects of static electricity. In addition to negatively affecting the packaged components, static electricity can cause handling problems by attracting dust, or even by attracting lighter weight components to the tape in a manner analogous to the way in which a child's plastic balloon can be made to stick to a wall.

As generally used, the terms "antistatic" and "static dissipating" both refer to the same property: conductivity. The term "static dissipating" generally refers to a higher conductivity than does the term "antistatic." For example, antistatic is often used to characterize resistivities of $10^9$ to $10^{14}$ ohms per square, while static dissipative is used to characterize resistivities of $10^5$ to $10^9$ ohms per square. It will be understood that these terms are thus used descriptively rather than in any absolute or unreasonably limiting sense. In the invention set forth in the Detailed Description that follows, the structures are of higher conductivity and thus best described as static dissipative.

Some of the traditional or conventional compounds used to obtain antistatic and static dissipative properties are carbon black and the quaternary ammonium salts. Carbon black, however, lacks transparency when used in amounts sufficient to provide the desired static dissipative properties. The quaternary salts are disadvantageously sensitive to moisture so that their conductivity can change based on changes as slight as changes in the ambient relative humidity. Therefore, a static dissipative cover tape for integrated circuit components or the like needs to be more transparent than carbon black and more consistent in its antistatic properties than quaternary ammonium salts.

Furthermore, because automated or robotic equipment is often used to open the packages and remove the cover tape, the tape must exhibit very consistent adhesive characteristics. Stated differently, the force needed to remove the tape must be consistent within each package and from package to package. Such adhesive characteristics are also referred to as "controlled release."

Finally, because static electricity can build up on either or both sides of the cover tape, both sides should have antistatic characteristics. The presence of adhesive on one side, however, can interfere with any desired static dissipative coating.

OBJECT AND SUMMARY OF THE INVENTION

Therefore, it is an object of the present invention to provide an improved static dissipative transparent cover tape for circuit component packages.

The invention meets this object with a transparent static dissipative adhesive tape which comprises a transparent polymer substrate having opposed first and second surfaces, a transparent antistatic coating on the first surface of the substrate, and a transparent antistatic adhesive coating on the second surface of the substrate. The adhesive coating comprises a transparent conductive layer on the second surface of the substrate formed of conductive particles in a polymer matrix, and a transparent adhesive layer without any conductive particles over the conductive layer. The exposed surface of the adhesive layer exhibits conductivity substantially the same as the conductivity of the underlying conductive layer.

In another aspect, the invention comprises the method of applying a controlled release adhesive to a conductive surface to thereby cover the conductive surface with the adhesive while maintaining the surface conductivity of the resulting coated surface. The method comprises applying a first coating solution containing an adhesive dissolved in the solvent to the substrate wherein the amount of adhesive present in the solution is less than an amount that would block the conductivity of the conductive layer thereunder once the solvent is removed. The next step comprises applying a second coating solution containing the adhesive dissolved in the solvent to the substrate and wherein the amount of adhesive present in the second coating solution is less than the amount that would block the conductivity of the conductive layer thereunder once the solvent is removed.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
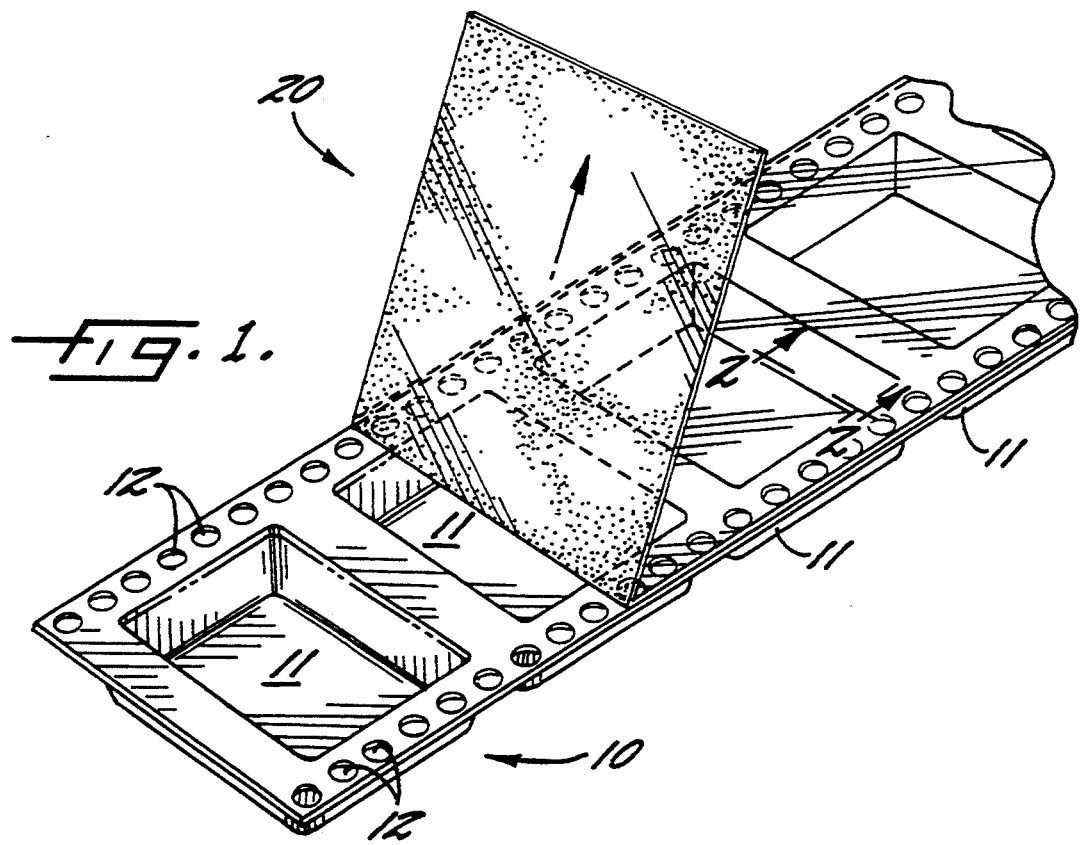
FIG. 1 is an environmental view in perspective showing a carrier strip of the type with which the cover tape of the present invention is used.

The present invention is a transparent static dissipative cover tape. FIG. 1 shows the tape in one of its most useful environments, a cover tape for packaging electronic components. In FIG. 1, the pocketed carrier tape is broadly designated at 10. Four pockets 11 are illustrated in which the electronic components are carried.

For the sake of clarity of illustration, the pockets 11 are shown as being empty, but their purpose will be understood. A plurality of sprocket holes 12 run longitudinally along the carrier tape 10, and although illustrated as being circular, the holes 12 could similarly be square, rectangular, or some other shape as desired or necessary. Similarly, although FIG. 1 shows two parallel rows of sprocket holes 12, it will be understood that other tapes have only one row, and yet others have none and are handled by some other mechanism. The cover tape of the present invention is broadly designated at 20 in FIG. 1 and is illustrated in a partially removed orientation.

Figure 2:
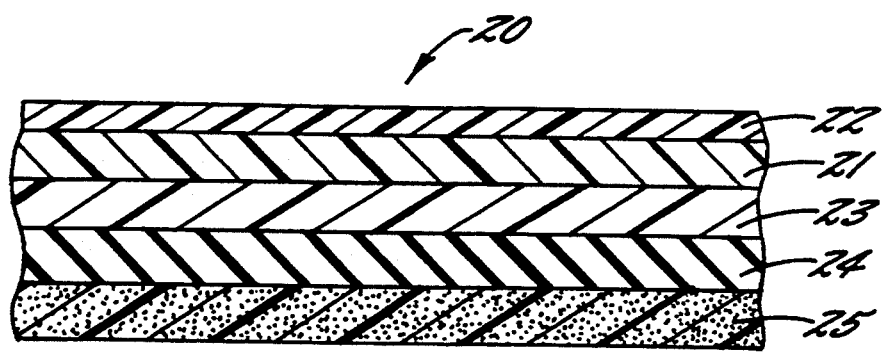
FIG. 2 is a cross-sectional view of a preferred embodiment of the cover tape of the present invention, and taken along lines 2—2 of FIG. 1.

FIG. 2 is a cross-sectional view of the tape 20. The tape 20 first comprises a transparent polymer substrate 21. The preferred material for the substrate is polyester (including other polyesters in addition to polyethylene terphthalate), but other appropriate substrates could include —but are not limited to—polypropylenes, polyethylenes, polystyrenes, polyimides, polyvinyl chlorides, nylons, polyurethanes, or even combination of these and other polymers. The polyester layer 21 is generally between about 0.15 and 3 mils thick in preferred embodiments (1 mil equals 0.001 inch), and these thicknesses are often referred to as between about 15 and 300 gauge (100 gauge equals 1 mil).

In the cross-sectional orientation of FIG. 2, the chips would be packaged below the substrate 21, while the exposed face would be above the polyester layer 21. The first or upper surface of the substrate 21 is coated with a transparent static dissipative coating 22. A number of coatings are appropriate, but preferred coatings are selected from the group consisting of nickel-chromium alloys (e.g., Nichrome) and magnesium silicate ("Laponite") clays. Commercially available Nichrome typically contains 60% nickel, 24% iron, 16% chromium, and a small amount (0.1%) carbon. Nichrome offers the advantages of good conductivity, ease of application, and good adhesion to the substrate.

Laponite is a common name for an entirely synthetic smectite clay which closely resembles the natural clay hectorite in structure and composition. Laponite is a layered hydrous magnesium silicate which is used as a thickener, a suspension agent, an emulsion stabilizer, and as a static dissipative coating. Preferably, the Laponite is maintained on the film 21 using a binder such as an acrylic or polyurethane compound. Laponite is available commercially from Southern Clay Products, Inc., 1212 Church Street, Gonzales, Tex., 78629. Laponite is also available from LaPorte in the very similar form of a hydrous sodium lithium magnesium silicate smectitic-type clay modified with tetrasodium pyrophosphate. Laponite is optically clearer than Nichrome, gives resistivities of about $10^5$ ohms per square, and doesn't exhibit the moisture sensitivity of quaternary ammonium compounds.

In preferred embodiments, the second surface of the substrate 21 is coated with a primer layer 23 which forms an appropriate transition between the substrate 21 and the conductive and adhesive layers beneath it. One useful polyurethane primer material is available under the Permuthane U26-249 trade name from Permuthane Coatings, Corwin Street, P. O. Box 3039, Peabody, Mass., 01961-3039, which is marketed as urethane resin solution containing propylene glycol monomethylether, xylene (dimethylbenzene), and ethyl acetate (acetic acid ethyl ester). The resin is clear, cross-linkable, light-fast, and provides hydrolytic stability and excellent flex life. Permuthane is commonly used in textile-related applications such as upholstery that require wear resistance and extended flex life.

Other polymers suitable for the primer layer 23 include polyesters, nitrile phenolics, and potentially acrylic polymers.

The tape 20 next includes a transparent conductive layer 24 on the polyurethane primer layer 23. The transparent conductive layer 24 is formed of conductive particles in an appropriate matrix. Suitable matrices can include chlorinated rubber, mixtures of EVA and chlorinated rubber, polyester, polyurethanes, polyvinyl acetate, or polyvinyl chloride (PVC). In preferred embodiments, the conductive particles comprise particles selected from the group consisting of mica and titanium dioxide ($TiO_2$), and in which the particles are conductively coated with coatings selected from the group consisting of doped oxides of antimony (Sb) and doped oxides of tin. Such coated particles are thoroughly described in Lawton, et al., *Development of Highly Efficient Static Dissipative Systems Based on Electroconductive Powders*, Dupont Publication No. H-41686 (September 1992) available from the Dupont Chemicals Jackson Laboratory, Deepwater, N.J. 08023. Other information is available from EM Industries, Inc., Pigment Division, 5 Skyline Drive, Hawthorne, N.Y., 10532; and from whom the MINATEC® conductive materials are available.

Doped metal oxides (for example, antimony doped tin oxide $SnO_2$) offer significant advantages in transparency when compared with other conductive materials such as carbon black. As noted earlier, carbon black has good conductive properties, but poor transparency. Doped metal oxides are relatively expensive, however, and are usually required in somewhat higher percentages to achieve comparable levels of conductivity in the resulting applications. Thus, in the preferred embodiment of the invention, the advantages of the antimony-doped tin oxides are extended by coating this compound onto the surface of less expensive inert powders such as mica or titanium dioxide.

The final layer of the overall tape structure 20 is the adhesive layer 25 which in the present invention does not contain any conductive particles, but instead is positioned over the conductive layer in a manner that allows the exposed surface of the adhesive to exhibit substantially the same conductivity as that of the underlying conductive layer 24.

The conductive particles just described are maintained in a polymer matrix which in preferred embodiments is a blend of ethylene vinyl acetate (EVA) and chlorinated rubber, an appropriate example of which is Alloprene TM chlorinated rubber available from ICI Resins U.S., 730 Main Street, Wilmington, Mass., 01887-0667. Alloprene is a low to medium molecular weight chlorinated rubber which is compatible with a wide range of resins. As known to those familiar with such chemicals, chlorinated rubbers in general consist of natural rubbers or polyolefins to which about 65% of chlorine have been added to give a solid, film-forming resin. Other commercially available chlorinated rubbers include the Parlon TM and Hypalon TM resins. As noted above, other suitable matrices can include mixtures of EVA and chlorinated rubber, polyester, polyurethanes, polyvinyl acetate, and polyvinyl chloride.

In preferred embodiments, the adhesive layer is a heat-sealable ethylene vinyl acetate (EVA) toughened with a chlorinated polypropylene. Ethylene-vinyl acetate copolymers are well-known as elastomers used to improve adhesion properties of hot-melt and pressure-sensitive adhesives. A commercially available resin useful in the present invention is Morton 49R15J (from Morton International, 10 South Electric Street, West Alexandria, Ohio, 45381), which is most preferably used in a mixture of 78% by weight with 22% by weight of chlorinated polypropylene. One of the advantages of such material is that it will melt and flow at temperatures of about 170° C., making it quite useful for heat-sealable purposes. Preferably, the adhesive also includes the Hardelin TM AP 13 T chlorinated polyolefin from Advanced Polymers, Inc., 654 Gotham Parkway, Carlstadt, N.J. 07072, to toughen and harden the adhesive layer 25.

The resulting static dissipative tape 20 has a resistivity on the first surface 22 of between about $10^4$ and $10^{10}$ ohms per square, and the surface of the adhesive layer has a resistivity of between about $10^4$ and $10^7$ ohms per square.

In the resulting structure, the adhesive layer 25 has a thickness of between about 0.15 and 0.50 mil, the conductive layer has a thickness of between about 0.15 and 0.25 mil, and the primer layer 23 has a thickness of between about 0.25 and 0.28 mil. Expressed in different terminology, the adhesive layer contains between about two and ten pounds per ream of the heat seal adhesive, the conductive layer contains between about three and seven pounds per ream, and the primer layer contains about five pounds per ream of primer.

In another aspect, the invention comprises a method of applying a controlled release adhesive to a conductive surface to thereby cover the conductive surface with the adhesive while maintaining the surface conductivity of the resulting coated surface. In this regard, it has been discovered that if a single layer of adhesive is applied over the conductive layer in an amount sufficient to give the adhesive properties, the conductivity of the resulting exposed adhesive surface can occasionally be lowered unacceptably. Thus, according to the present invention, a first coating solution is applied to the substrate and contains an adhesive dissolved in a solvent. The amount of adhesive present in the solution is less than an amount that would block the conductivity of the conductive layer thereunder once the solvent is removed. Having so protected the conductivity, the next step comprises applying a second, third, and potentially subsequent coating solutions containing the adhesive dissolved in the solvent, and wherein the amount of adhesive present in the second and subsequent coating solutions is less than the amount that would block the conductivity of the conductive layer once the solvent was removed from that application.

In preferred embodiments, the method comprises the step of removing the solvent between each application of the adhesive coating solution.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A transparent static dissipative adhesive tape comprising:
    a transparent polymer substrate having opposed first and second surfaces;
    a transparent static dissipative coating on said first surface of said substrate; and
    a transparent static dissipative adhesive coating on said second surface of said substrate, said adhesive coating comprising,
    a transparent conductive layer on said opposed second surface of conductive particles in a polymer matrix, and
    a compatible transparent adhesive layer without any conductive particles coated over said conductive layer,
    wherein the exposed surface of said adhesive layer exhibits conductivity substantially the same as the conductivity of said underlying coated conductive layer.

2. A static dissipative tape according to claim 1 wherein said polymer substrate is selected from the group consisting of polymers, polypropylenes, polyethylenes, polystyrenes, polyimides, nylons, polymethanes and polyvinyl chlorides.

3. A static dissipative tape according to claim 2 wherein said substrate is between about 0.15 and 3 mils thick.

4. A static dissipative tape according to claim 1 wherein said transparent static dissipative coating on said first surface of said substrate is selected from the group consisting of nickel-chromium alloys and magnesium-silicate clays.

5. A static dissipative tape according to claim 4 wherein said static dissipative coating comprises a magnesium-silicate clay in a binder selected from the group consisting of acrylic copolymers, chlorinated rubber, mixtures of chlorinated rubber and ethylene vinyl acetate, polyester, polyurethane, polyvinyl acetate, or polyvinyl chloride.

6. A static dissipative tape according to claim 1 and further comprising a primer layer on said second surface of said substrate.

7. A static dissipative tape according to claim 6 wherein said primer layer is a polymer selected from the group consisting of: polyurethane, polyester, nitrile phenolics, and acrylic polymers.

8. A static dissipative tape according to claim 1 wherein said conductive particles in said adhesive layer comprise doped oxides of antimony and doped oxides of tin.

9. A static dissipative tape according to claim 1 wherein said conductive particles in said adhesive layer comprise:
    particles selected from the group consisting of mica, silica, and titanium dioxide; and wherein
    said particles are conductively coated with coatings selected from the group consisting of doped oxides of antimony and doped oxides of tin.

10. A static dissipative tape according to claim 1 wherein said adhesive layer comprises a heat-sealable mixture of ethylene vinyl acetate, chlorinated rubber, and a chlorinated olefin.

11. A static dissipative tape according to claim 10 wherein said adhesive layer will melt and flow at temperatures of about 170° C.

12. A static dissipative tape according to claim 1 wherein said static dissipative coating on said first surface has a resistivity of between about $10^4$ and $10^{10}$ ohms per square, and said exposed surface of said adhesive layer has a resistivity of between about $10^4$ and $10^7$ ohms per square.

13. A transparent static dissipative adhesive tape comprising:

a transparent polyester substrate having opposed first and second surfaces;

a transparent static dissipative coating on said first surface of said substrate; and a transparent static dissipative adhesive coating on said second surface of said substrate, said adhesive coating comprising, a polyurethane primer layer on said opposed second surface of said substrate, a compatible transparent conductive layer on said polyurethane primer layer, and formed of conductive particles in a matrix blend of ethylene vinyl acetate and chlorinated rubber, and a transparent adhesive layer without any conductive particles coated over said conductive layer, wherein the exposed surface of said adhesive layer exhibits conductivity substantially the same as the conductivity of said underlying coated conductive layer.

14. A static dissipative tape according to claim 13 wherein said primer layer is a polymer selected from the group consisting of: polyurethane, polyester, nitrile phenolics, and acrylic polymers.

15. A static dissipative tape according to claim 13 wherein said adhesive layer has a thickness of between about 0.15 and 0.50 mil;

said conductive layer has a thickness of between about 0.15 and 0.25 mil; and said primer layer has a thickness of between about 0.25 and 0.28 mil.

16. A static dissipative tape according to claim 15 wherein said adhesive layer will seal at temperatures of between about 170° C. and 200° C.

17. A static dissipative tape according to claim 13 wherein said transparent static dissipative coating on said first surface is selected from the group consisting of nickel-chromium alloys and magnesium-silicate clays.

18. A static dissipative tape according to claim 17 wherein said static dissipative coating comprises a magnesium-silicate clay in a binder selected from the group consisting of acrylic copolymers, chlorinated rubber, mixtures of chlorinated rubber and ethylene vinyl acetate, polyester, polyurethane, polyvinyl acetate, or polyvinyl chloride.

19. A static dissipative tape according to claim 13 wherein said conductive particles in said adhesive layer comprise:

particles selected from the group consisting of mica and titanium dioxide; and wherein said particles are conductively coated with coatings selected from the group consisting of doped oxides of antimony and doped oxides of tin.

20. A static dissipative tape according to claim 13 wherein said static dissipative coating on said first surface has a resistivity of between about $10^5$ and $10^{10}$ ohms per square, and said surface of said adhesive layer has a resistivity of between about $10^4$ and $10^8$ ohms per square.

* * * * *

UNITED STATES PATENT AND TRADEMARK OFFICE
CERTIFICATE OF CORRECTION

PATENT NO. :   5,447,784
DATED      :   September 5, 1995
INVENTOR(S):   Williams et al.

It is certified that error appears in the above-identified patent and that said Letters Patent is hereby corrected as shown below:

Column 6, line 7, after "surface" insert --formed--.

Column 6, line 17, "polymers" should be
--polyesters--.

Signed and Sealed this

Twelfth Day of March, 1996

Attest:

BRUCE LEHMAN

*Attesting Officer*      Commissioner of Patents and Trademarks